(12) United States Patent
Bois et al.

(10) Patent No.: US 7,088,110 B1
(45) Date of Patent: Aug. 8, 2006

(54) SYSTEM AND METHOD FOR DETERMINING S-PARAMETERS OF A CONNECTED STRUCTURE

(75) Inventors: Karl Joseph Bois, Fort Collins, CO (US); David W. Quint, Fort Collins, CO (US); Yong Wang, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 58 days.

(21) Appl. No.: 10/915,235

(22) Filed: Aug. 10, 2004

(51) Int. Cl.
*G01R 27/32* (2006.01)
(52) U.S. Cl. ........................ 324/638; 324/650
(58) Field of Classification Search ............... None
See application file for complete search history.

(56) References Cited

U.S. PATENT DOCUMENTS

| | | | |
|---|---|---|---|
| 5,321,364 A | 6/1994 | Nukiyama et al. | |
| 5,336,988 A | 8/1994 | Chmielewski et al. | |
| 5,442,296 A | 8/1995 | Schiek et al. | |
| 5,572,160 A | 11/1996 | Wadell | |
| 5,784,299 A * | 7/1998 | Evers et al. | 702/85 |
| 6,539,344 B1 | 3/2003 | Stengel et al. | |
| 6,639,393 B1 * | 10/2003 | Tasker et al. | 324/76.19 |
| 6,643,597 B1 * | 11/2003 | Dunsmore | 702/104 |
| 6,653,848 B1 | 11/2003 | Adamian et al. | |
| 6,665,628 B1 | 12/2003 | Martens | |

OTHER PUBLICATIONS

Agilent Technologies, "Agilent RF and Microwave Test Accessories", www.agilent.com/find/accessories. Dec. 2000.
Anritsu, "Application Note Embedding/De-embedding; Scorpion Simulated Removal & Insertion of Fixtures, Matching and Other Networks", Nov. 2001, pp. 1-15.
Hewlett Packard, "Test & Measurement Application Note 95-1; S-Parameter Techniques for Faster, More Accurate Network Design," http://www.hp.com/go/tmappnotes, Nov. 1996, pp. 1-79.

* cited by examiner

*Primary Examiner*—Vincent Q. Nguyen (57) ABSTRACT

One disclosed embodiment may include a method that includes providing a first set S-parameters for a path of a first substrate having a first port and a second port and providing a second set of S-parameters for a path of a second substrate having a first port and a second port. Waveform parameters are measured for an aggregate path that includes the path of the first substrate, the path of the second substrate, and a structure interconnecting the first and second substrates to provide a third set of S-parameters. A fourth set of S-parameters is calculated for the structure interconnecting the first and second substrates based on the first, second, and third sets of S-parameters.

25 Claims, 6 Drawing Sheets

SYSTEM AND METHOD FOR DETERMINING S-PARAMETERS OF A CONNECTED STRUCTURE

BACKGROUND

Scattering parameters, or S-parameters, are a set of parameters that describe the scattering and reflection of traveling waves relative to a network. S-parameters are normally employed to characterize high frequency networks and systems, such as when existing models, which are valid at low frequencies, tend to become inaccurate. As device densities in integrated circuits continue to increase and as circuit boards and packaging become more complex, the measurement of S-parameters also becomes increasingly difficult. This difficulty results at least in part from the complexity of attaching measurement probes directly to the ports of a network. Additionally, the interrelationships between components and interconnected parts of a network can affect the accuracy of S-parameter measurements.

SUMMARY

One embodiment of the present invention may comprise a method that includes providing a first set of S-parameters for a path of a first substrate having a first port and a second port and providing a second set of S-parameters for a path of a second substrate having a first port and a second port. Waveform parameters are measured for an aggregate path that comprises the path of the first substrate, the path of the second substrate, and a structure interconnecting the first and second substrates to provide a third set of S-parameters. A fourth set of S-parameters is calculated for the structure interconnecting the first and second substrates based on the first, second, and third sets of S-parameters.

Another embodiment may comprise a system that includes a measurement system operative to access measurement data comprising a first set of S-parameter data for a path associated with a first port and a second port of a first substrate, a second set of S-parameter data for a path associated with a first port and a second port of a second substrate, and a third set of S-parameter data for a path associated with the first port of the first substrate and the second port of the second substrate. An S-parameter system is operative to calculate a fourth set of S-parameter data for a structure interconnecting the second port of the first substrate and the first port of the second substrate based on the first, second, and third sets of S-parameter data.

Yet another embodiment may comprise a circuit analysis system that includes measurement data comprising a first set of S-parameter data for a path associated with a first port and a second port of a first printed circuit board, a second set of S-parameter data for a path associated with a first port and a second port of a second printed circuit board, and a third set of S-parameter data for a path electrically coupled between the first port of the first printed circuit board and the second port of the second printed circuit board. The path electrically coupled between the first port of the first printed circuit board and the second port of the second printed circuit board includes a connector A matrix transform converts the first, second, and third sets of S-parameters into a T-matrix transform representation thereof. A calculator manipulates the T-matrix transform representation of the first, second, and third sets of S-parameters to solve for a matrix of values associated with the at least one connector. A reverse transform converts the T-matrix of values associated with the at least one connector to a fourth set of S-parameters associated with the at least one connector.

Another embodiment may comprise a computer readable medium having computer executable instructions for performing a method that includes accessing measurement data that includes a first set of S-parameter data for a path associated with a first port and a second port of a first substrate, a second set of S-parameter data for a path associated with a first port and a second port of a second substrate, and a third set of S-parameter data for an aggregate path associated with the first port of the first substrate and the second port of the second substrate. A fourth set of S-parameter data is calculated for a connector based on the first, second, and third sets of S-parameter data.

Still another embodiment may comprise a system that includes means for accessing a first set of S-parameters for a path associated with a first port and a second port of a first substrate. The system also includes means for accessing a second set of S-parameters for a path associated with a first port and a second port of a second substrate. The system also includes means for measuring waveform parameters associated with an aggregate electrical path from the first port of the first substrate and the second port of the second substrate and for providing a third set of S-parameters for the aggregate electrical path based on the measured waveform parameters. The system also includes means for calculating a fourth set of S-parameters for a structure electrically interconnecting the first and second substrates based on the first, second, and third sets of S-parameters, the structure forming part of the aggregate electrical path.

DETAILED DESCRIPTION

Figure 1:
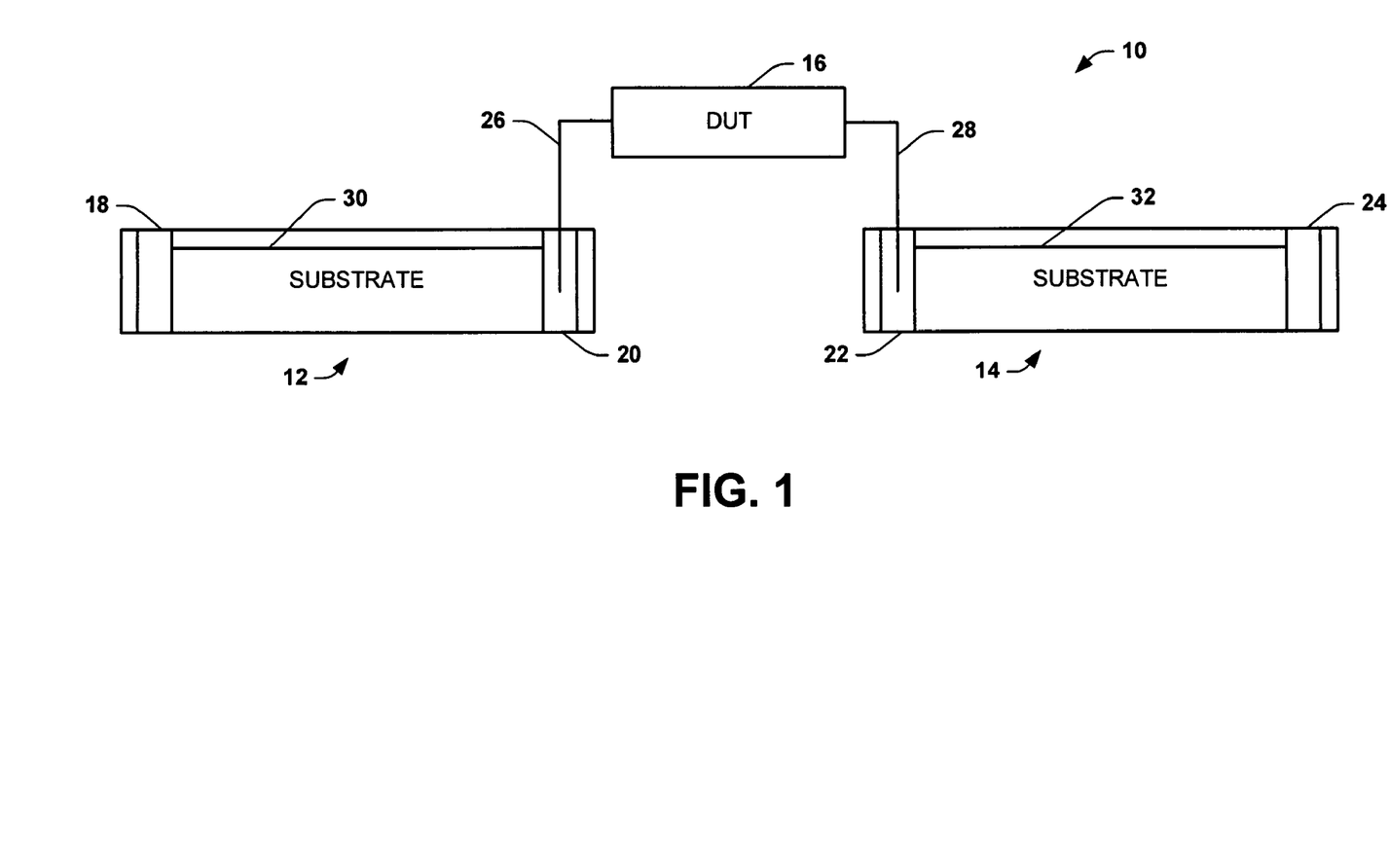
FIG. 1 illustrates an embodiment of a system for which S-parameters can be determined.

FIG. 1 depicts an example of a network 10 for which scattering parameters (S-parameters) can be determined. The network 10 includes two substrates 12 and 14, and a device-under-test (DUT) 16 connected between the substrates. The two substrates 12 and 14 can be any type of network or other electronic device, including, for example, a printed circuit board, a package, or a combination of circuit board and package. Each of the respective substrates 12, 14 can be characterized by a set of associated S-parameters that can be measured (e.g., by a network analyzer or similar equipment) to provide an indication of its operation, such as in terms of gain and reflection coefficients.

The DUT 16 electrically connects or interfaces the two substrates 12 and 14. The DUT 16 could be any type of interface or other structure operative to communicatively connect the substrates 12 and 14, including, for example, a connector. Examples of connector types include a sub-miniature type-A (SMA) connector, a sub-miniature type-B (SMB) connector, and a bayonet type-N (BNC) connector, to name a few. Similar to the substrates, the DUT 16 can be characterized by a set of associated S-parameters to provide an indication of its operation. In the example of FIG. 1, each of the substrates 12 and 14 comprises two ports, namely ports 18 and 20 for substrate 12, and 22 and 24 for substrate 14. The ports 20 and 22 can be implemented as plated through-holes or other interface structures depending, for example, on the type of DUT 16 being utilized. DUT 16 is conductively coupled to port 20 of substrate 12 and to port 22 of substrate 14 via electrically conductive portions, schematically indicated 26 and 28, at which are configured for electrically and physically connecting respective ports 20 and 22.

Ports 18 and 20 of substrate 12 are electrically connected together through one or more electrical paths 30, and ports 22 and 24 of substrate 14 are electrically connected through electrical path 32. The electrical paths 30 and 32, for example, correspond to a length of an electrically conductive material (e.g., stripline or microstrip) formed in the respective substrates 12 and 14, such as can be employed to provide electrical power or communicate other signals to various regions of the substrates. That is, electrical paths 30 and 32 can be coupled to various components on the respective substrates 12 and 14, which couplings may influence operating characteristics of the substrates. The substrate operating characteristics can be evaluated by measuring a set of waveform parameters of substrate 12 and a set of waveform parameters of substrate 14. Corresponding sets of S-parameters can be determined from the waveform parameters using numerical methods.

Additionally, a set of S-parameters associated with ports 18 and 24, which corresponds to an aggregate electrical path through network 10, can be determined from measurements of waveform parameters associated with such ports. The aggregate electrical path thus begins at port 18, extends through electrical path 30, continues through end portion 26, DUT 16, and end portion 28. The aggregate path then traverses substrate 14 through the port 22, through electrical path 32 and ends at port 24.

When the DUT 16 is implemented as a connector, the end portions 26 and 28 are dimensioned and configured for mating attachment with the respective ports 20 and 22 of the substrates. Typically, the ports 20 and 22 are formed in the respective substrates 12 and 14 according to the desired types of connector end portions 26 and 28 being used. The end portions 26 and 28 can be the same or different types of connector portions.

By way of example, measurement probes can be attached to ports 18 and 20 to obtain a first set of waveform parameters for substrate 12, and to ports 22 and 24 to obtain a second set of waveform parameters for substrate 14. The sets of waveform parameters (e.g., amplitude or voltage) can be measured at the respective ports of the substrates. A set of S-parameters for each substrate 12 and 14 can be computed based on the measured waveform parameters. Alternatively, the S-parameters can correspond to a predetermined set of S-parameter data, such as may be provided by a manufacturer of the substrates 12 and 14. Probes can also be connected to ports 18 and 24 to obtain waveform parameters corresponding to the aggregate network 10 including the DUT 16 coupled between the substrate 12 and 14. A third set of S-parameters can be determined from the measured waveform parameters for the aggregate network 10.

Using these three sets of measured S-parameters, as described herein, the S-parameters of the DUT 16 can be determined independently of adverse effects that ports 20 and 22 (e.g., plated through-holes) may have on the measured S-parameter values of the DUT 16, such as wave reflection. For example, the S-parameters for the substrates 12 and 14 and the aggregate path can be transformed to respective matrices, and related with an unknown set of S-parameters for the connector. Through matrix manipulation and a reverse transform back to the S-parameter domain, one may solve for the unknown set of S-parameters of the DUT 16.

Figure 2:
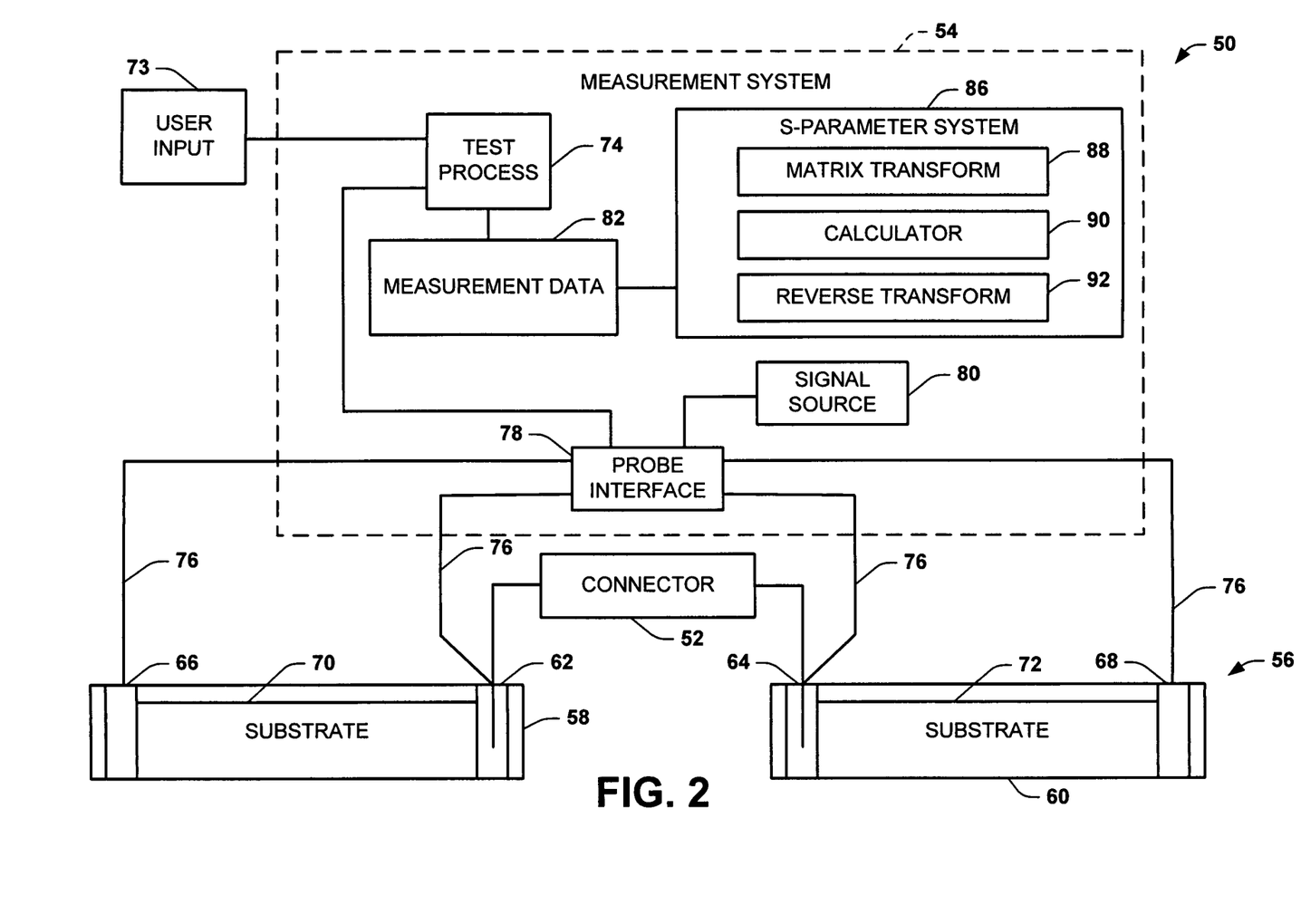
FIG. 2 illustrates an embodiment of a system for determining S-parameters of a part of a network.

FIG. 2 illustrates a system 50 for determining a set of S-parameters for a connector 52. The system 50 includes a measurement system 54 that is programmed to measure waveform parameters that determine S-parameters for a network 56 that includes the connector 52. The measurement system 54 can by implemented as a network analyzer or other test equipment. In the example of FIG. 2, the connector 52 is coupled between a pair of substrates (e.g., printed circuit boards) 58 and 60 similar to that shown and described with respect to FIG. 1. Specifically, the connector 52 is coupled between a port 62 of the substrate 58 and a port 64 of the substrate 60. The respective ports 62, 64 can be implemented as plated through-holes of the circuit board substrates 58 and 60. Other ports 66 and 68 correspond to probe points, which can be provided at arbitrary points on the substrate. The probe points can be implemented as electrically conductive pads or as plated through-holes, as depicted in FIG. 2. The respective ports 62 and 66, 64 and 68 can be coupled together through respective electrical paths 70 and 72, such as striplines or microstrips that provide power or ground connections for the circuit board substrates.

A user input device 73 is also connected to the measurement system 54 to provide instructions for controlling the system. The input device 73, for example, could be any means (e.g., a keyboard, pointing device, and the like) for a user to input information or instructions into the measurement system 54, such as measurement start/stop commands or storage instructions. The measurement system 54 also employs a test process 74 programmed to enable a user (via user input device 73) to operate any number of functions associated with controlling input signals supplied to one or more probes, schematically illustrated at 76, through a corresponding probe interface 78 as well as for controlling measurements taken with such probes. For instance, test process 74 can be employed to measure waveform parameter data for network 56 as well as compute corresponding S-parameters based on such measurements. A resulting set of S-parameters can then be determined for connector 52. User input device 58, for example, can interface with test process 74 to access waveform parameter data, such as retrieving previously stored data, measuring new waveform parameters, displaying one or more S-parameter data sets, or changing data value scaling parameters.

By way of further example, measurement system 54 also employs a set of measurement probes 76 to connect to the ports of each the respective substrates 58 and 60. The probes 76 can be connected to the respective ports to measure waveform parameters for each of the substrate 58, the substrate 60 and the aggregate network 56. In the case of the substrate 58, implemented as a printed circuit board with ports 62 and 66, which could be plated through-holes, for instance, the measurement system 54 can obtain a set of waveform parameters for the substrate 58. Thus, after having removed connector 52 from network 56, the waveform parameters can be measured at the respective ports 66 and 62 via probes 76 connected to such ports based on an input test signal from a signal source 80. Measurement probes 76 could, for example, be connected to any part of the ports, such as underneath the substrate in the case of plated through-holes. That is, the measurement probes are not limited to a connection at the top of the substrate, as shown in FIG. 2. The signal source 80 can be part of the measurement system 54 (as shown) or it can be implemented separately from the measurement system.

Characteristically, the waveform parameters (e.g., amplitude or voltage) include a transmitted portion $V_{1m}$ of the input signal, i.e., the portion of the input signal $S_1$ transmitted to the substrate 58 from the signal source 80. The waveform parameters also include the reflected portion $V_{1p}$ of the input signal, i.e., the portion of the input signal reflected back toward the signal source 80 from the substrate 58. The waveform parameters can also include the transmitted portion $V_{2m}$ of the output signal, i.e., the portion of the output signal transmitted from the substrate 58, and the reflected portion $V_{2p}$ of the output signal, i.e. the portion of the output signal reflected back toward the substrate. The measured waveform parameters for the substrate 58 are stored in the measurement data block 82 as a set of parameters associated with the substrate 58. Corresponding S-parameters are computed based on the measured waveform parameters and stored in the measurement data block 82 as a set of S-parameters for the substrate 58. The measurement data block 82 could include memory storage, such as volatile (e.g., random access memory) or non-volatile memory (e.g., flash, hard disk drive, etc.).

With connector 52 still removed from network 56, a set of measurements are also obtained from the substrate 60. A corresponding set of S-parameters are determined and stored in the measurement data block 82 as another set of S-parameters. Additionally, after re-attaching connector 52 to network 56, a set of measurements are also performed on the network 56 that is connected between ports 66 and 68 via a set of probes 76. A corresponding set of S-parameters are determined based on the measured waveform parameters stored in the measurement data block 82 as a set of S-parameters for the aggregate network 56.

The measurement system 54 also includes an S-parameter system 86. The S-parameter system 86 utilizes the sets of S-parameter values stored in the measurement data block 82 to calculate a set of S-parameters for the connector 52. To calculate the S-parameter values of the connector 52, the S-parameter system 86 first accesses the S-parameter values stored in the measurement data block 82, such as those measured with the measurement probes 76, as described above. Alternatively, the sets of stored S-parameters could be provided as manufacturer data and entered into the system 54. The S-parameter system 86 arranges the first, second, and third sets of S-parameters to solve for the unknown S-parameter values of the connector 52:

$$[S_1][S_C][S_2]=[S_3] \qquad \text{Equation 1}$$

where:
- $[S_1]$ represents a set of S-parameters associated with the substrate 58;
- $[S_2]$ represents a set of S-parameters associated with the substrate 60;
- $[S_3]$ represents a set of S-parameters associated with the network 56; and
- $[S_C]$ represents a set of S-parameters associated with the connector 52.

From Equation 1, $[S_C]$ represents an unknown parameter that is not directly measurable with a desired degree of accuracy. To ascertain $[S_C]$ from the values of $[S_1]$, $[S_2]$, and $[S_3]$, a matrix multiplication must be performed. However, S-parameter values from Equation 1, not being true matrices, do not concatenate and thus cannot be manipulated as matrices to solve for $[S_C]$.

Accordingly, the S-parameter system 86 includes a matrix transform function 88 that is operative to convert the S-parameters of Equation 1 to a corresponding matrix form to facilitate solving for values of $[S_C]$. The matrix transform function 88, for example, performs a transfer-matrix (T-matrix) transform on the respective sets of S-parameters to convert them to a form that is capable of manipulation using standard matrix algebra. Those skilled in the art will understand that, after performing the T-matrix transform on Equation 1, Equation 1 can be rewritten as follows:

$$[T_1][T_C][T_2]=[T_3] \qquad \text{Equation 2}$$

where:
- $[T_1]$ represents the T-matrix transform of $[S_1]$;
- $[T_2]$ represents the T-matrix transform of $[S_2]$;
- $[T_3]$ represents the T-matrix transform of $[S_3]$; and
- $[T_C]$ represents the T-matrix transform of $[S_C]$.

$[T_C]$ from Equation 2 thus represents the T-matrix transform of the S-parameter value of the connector independent of the ports 20 and 22, which corresponds to the S-parameter value sought to be determined. Since the transform matrix $[T_3]$ is represented in Equation 2 as the product of other $[T_1]$, $[T_2]$, and $[T_C]$, Equation 2 can be rewritten in terms of $[T_C]$ as follows:

$$[T_C]=[T_1]^{-1}[T_3][T_2]^{-1} \qquad \text{Equation 3}$$

The S-parameter system 86 performs matrix multiplication using calculator 90 to solve for $[T_C]$ in Equation 3. The calculator 90, for example, can be implemented using standard matrix manipulation tools, such as those available in MATLAB® software, which is available from Mathworks, Inc. Alternatively or additionally, those skilled in the art will appreciate that one or more portions of the S-parameter system 86 can be implemented manually or by employing other software utilities on the measurement data associated with the network 56.

After having solved for $[T_C]$ in Equation 3, the S-parameter system 86 employs a reverse matrix transform function 92 to convert $[T_C]$ to the unknown set of S-parameters $[S_C]$. As indicated above, $[S_C]$ corresponds to S-parameter values associated with the connector 52 independently of the ports 62 and 64 of the substrates to which the connector is connected. Those skilled in the art will appreciate that, as a result of the calculations and transformations on the measured S-parameter data, the S-parameter values are determined for the connector 52 without adverse measurement effects (e.g., wave reflection due to port geometry) associated with the plated through-holes 62 and 64 to which the connector 52 is attached.

Figure 3:
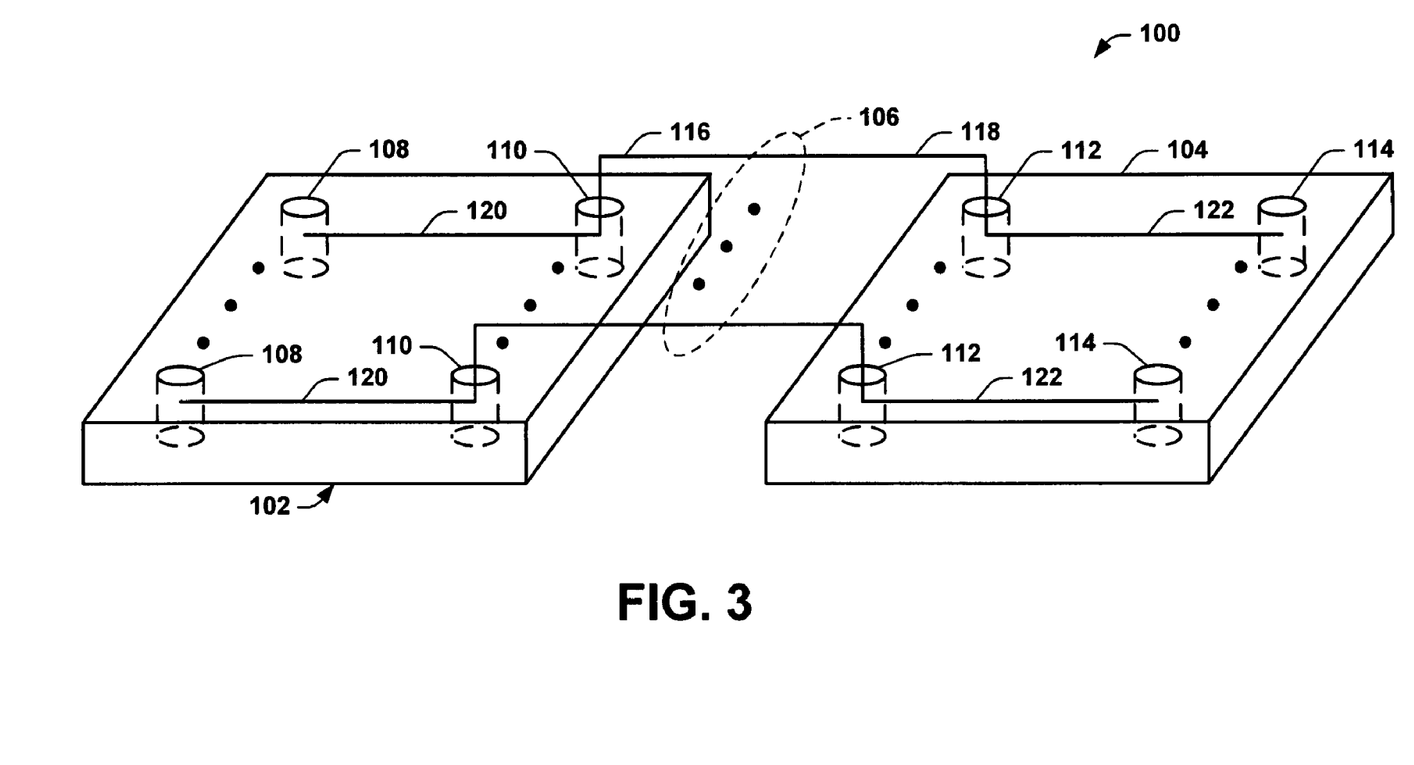
FIG. 3 illustrates an embodiment of a multi-port embedded connector for which S-parameters can be determined.

FIG. 3 depicts another example of a network 100 for which S-parameters can be determined. The network 100 includes two substrates 102 and 104, and a connector 106 connected between the substrates. The two substrates 102 and 104 can be any electronic circuitry, including, for example, a printed circuit board, a package, or a combination of a circuit board and package with IC's connected to the board. Each of the respective substrates 102 and 104 thus can be characterized by a set of associated S-parameters that provide an indication of the operation of the substrates. The S-parameters of the respective substrates 102 and 104 and of the total network 100 can be measured by a network analyzer or other similar type of test equipment.

As schematically depicted in FIG. 3, the respective substrates are multi-port networks that are electrically connected together via a connector 106. The connector 106 thus also operates as a multi-port network to connect or interface the substrates 102 and 104. Thus, similar to the substrates 102 and 104, the connector 106 can be characterized by a set of associated S-parameters for each port of the connector. The connector 106 could be any type of multi-conductor interface, or other structure operative to electrically connect the substrates 102 and 104. The connector 106, for example, can include a plurality of sub-miniature type-A (SMA) connectors, sub-miniature type-B (SMB) connectors, or bayonet type-N (BNC) connectors, or a combination of such connectors configured for mating corresponding port connections of the substrates 102 and 104.

Each of the substrates 102 and 104 comprise a plurality of ports, 108 and 110 for substrate 102, and ports 112 and 114 for substrate 104. The ports 108 and 114 can be implemented as electrically conductive pads, plated though-holes, or other means for electrically connecting a probe of an S-parameter system to the respective ports. Connector 106 is conductively coupled to at least one of and possibly all of ports 110 of substrate 102 and to ports 112 of substrate 104 via a plurality of electrically conductive members, schematically indicated at 116 and 118. Additionally, instead of a single connector with multiple ports, as shown in the example FIG. 3, connector 106 could be a plurality of individual connectors, each connecting one of the plurality of ports 110 to another one of the plurality of ports 112. In the example of FIG. 3, the ports 110 and 112 are implemented as plated through-holes, such as can be formed (e.g., by drilling) in the respective substrates 102 and 104 to fit the respective connector end portions 116 and 118 of the connector 106. A corresponding set of S-parameters can be computed based on the measurement data for the aggregate network 100. Additionally, ports 108 and 110 on substrate 102 are electrically connected through a plurality of respective electrical paths (e.g., microstrips or striplines) 120, and ports 112 and 114 on substrate 104 are electrically connected through a plurality of respective electrical paths 122.

Measurable sets of S-parameters for the substrate (e.g., a multi-port network) 102 are defined by the electrical paths of each pair associated with ports 108 and 110, including the electrical paths interconnecting the port pair. The set of S-parameters for a given path through the substrate 102, for example, can be determined based on waveform parameter measurements obtained by a network analyzer (not shown). The network analyzer can obtain the measurement data via probes connected to a respective pair of the ports 108 and 110 of the given path, while the ports associated with the other paths are shorted to ground and while the connector 106 is removed. Similar measurements can be performed to provide S-parameter data for each of the paths by connecting the network analyzer to different port combinations for such paths while grounding the other ports of the substrate 102 and keeping connector 106 disconnected. Other sets of S-parameters can be obtained for the substrate 104, namely by connecting probes to the respective ports 112 and 114 during measurements while other ports of the substrate are grounded.

Additionally, a set of S-parameters is also obtained for the aggregate network 100 when the connector 106 is connected between ports 110 and 112. The set of S-parameters for the network 100 thus provides an indication of the electrical characteristics associated with the combination of circuitry that includes the substrates 102 and 104 as well as the connector 106. By way of example, waveform parameters for a given one of the port combinations of the aggregate network 100 can be measured by a network analyzer or other test equipment while the other ports of the aggregate network are shorted to ground. A corresponding set of S-parameters can be computed based on the measurement data for the aggregate network 100. Using these three sets of S-parameters, a set of S-parameters for the connector 106 can be determined, such as described herein. Those skilled in the art will understand and appreciate that the set of S-parameters determined in such a manner is substantially independent of the effects (e.g., wave reflection) associated with ports 110 and 112 that are conductively coupled to connector 106.

Figure 4:
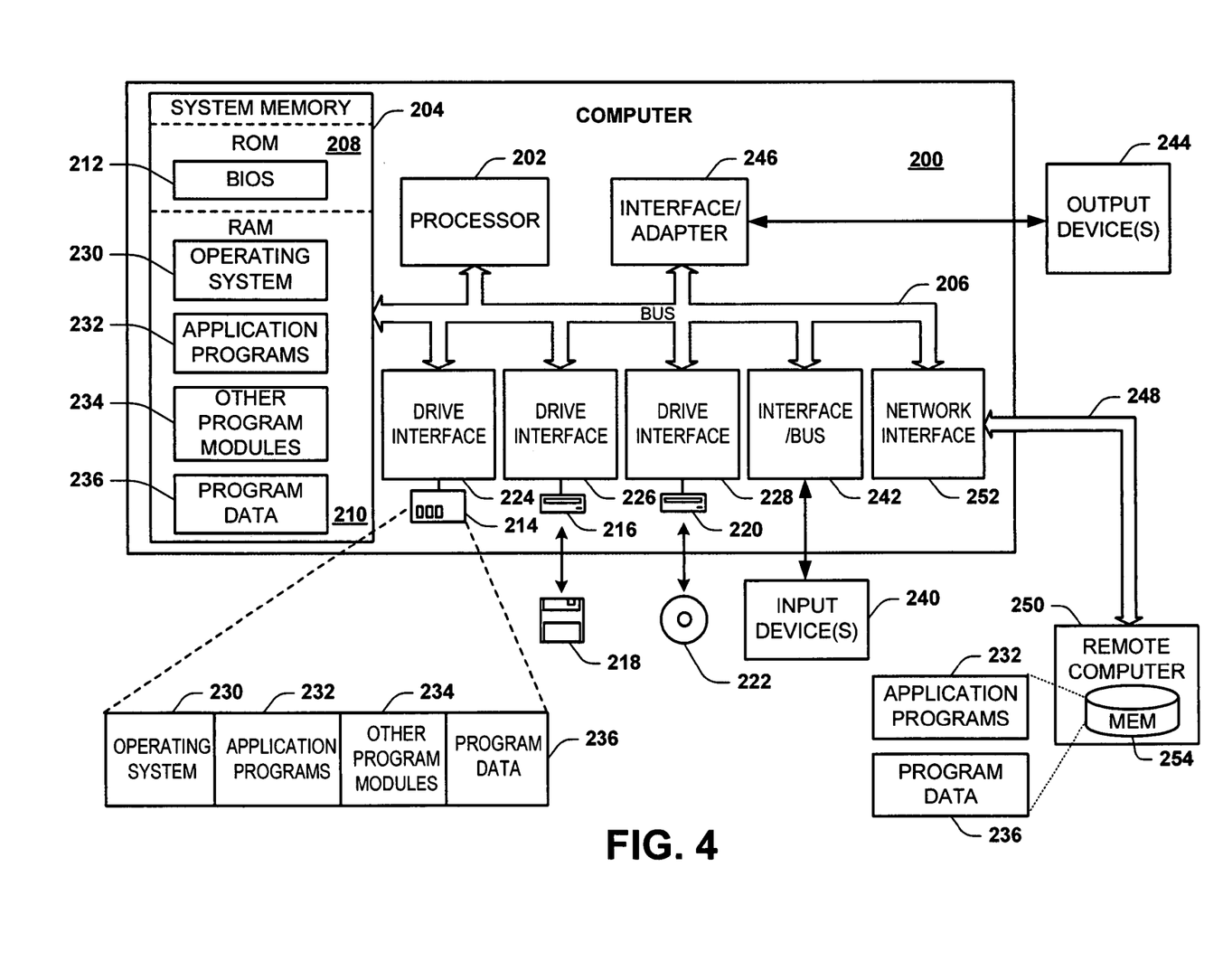
FIG. 4 illustrates an exemplary embodiment of a computer system that can be implemented to determine S-parameters.

FIG. 4 illustrates an example of a computer system 200 that can be employed to implement systems and methods described herein, such as based on computer executable instructions running on the computer system. The computer system 200 can be implemented on one or more general purpose networked computer systems, embedded computer systems, routers, switches, server devices, client devices, various intermediate devices/nodes and/or stand alone computer systems. Additionally, the computer system 200 can be implemented as part of a network analyzer or associated design tool running computer executable instructions to perform methods and functions, as described herein.

The computer system 200 includes a processor 202 and a system memory 204. A system bus 206 couples various system components, including the system memory 204 to the processor 202. Dual microprocessors and other multi-processor architectures can also be utilized as the processor 202. The system bus 206 can be implemented as any of several types of bus structures, including a memory bus or memory controller, a peripheral bus, and a local bus using any of a variety of bus architectures. The system memory 204 includes read only memory (ROM) 208 and random access memory (RAM) 210. A basic input/output system (BIOS) 212 can reside in the ROM 208, generally containing the basic routines that help to transfer information between elements within the computer system 200, such as a reset or power-up.

The computer system 200 can include a hard disk drive 214, a magnetic disk drive 216, e.g., to read from or write to a removable disk 218, and an optical disk drive 220, e.g., for reading a CD-ROM or DVD disk 222 or to read from or write to other optical media. The hard disk drive 214, magnetic disk drive 216, and optical disk drive 220 are connected to the system bus 206 by a hard disk drive interface 224, a magnetic disk drive interface 226, and an optical drive interface 234, respectively. The drives and their associated computer-readable media provide nonvolatile storage of data, data structures, and computer-executable instructions for the computer system 200. Although the description of computer-readable media above refers to a hard disk, a removable magnetic disk and a CD, other types of media which are readable by a computer, may also be used. For example, computer executable instructions for implementing systems and methods described herein may also be stored in magnetic cassettes, flash memory cards, digital video disks and the like. A number of program modules may also be stored in one or more of the drives as well as in the RAM 210, including an operating system 230, one or more application programs 232, other program modules 234, and program data 236.

A user may enter commands and information into the computer system 200 through user input device 240, such as a keyboard, a pointing device (e.g., a mouse). Other input devices may include a microphone, a joystick, a game pad, a scanner, a touch screen, or the like. These and other input devices are often connected to the processor 202 through a corresponding interface or bus 242 that is coupled to the system bus 206. Such input devices can alternatively be connected to the system bus 206 by other interfaces, such as a parallel port, a serial port or a universal serial bus (USB). One or more out device(s) 244, such as a visual display device or printer, can also be connected to the system bus 206 via an interface or adapter 246.

The computer system 200 may operate in a networked environment using logical connections 248 to one or more remote computers 250. The remote computer 248 may be a workstation, a computer system, a router, a peer device or other common network node, and typically includes many or all of the elements described relative to the computer system 200. The logical connections 248 can include a local area network (LAN) and a wide area network (WAN).

When used in a LAN networking environment, the computer system 200 can be connected to a local network through a network interface 252. When used in a WAN networking environment, the computer system 200 can include a modem (not shown), or can be connected to a communications server via a LAN. In a networked environment, application programs 232 and program data 236 depicted relative to the computer system 200, or portions thereof, may be stored in memory 254 of the remote computer 250.

By way of further example, the application programs 232 can include executable instructions programmed to determine the S-parameter data of various discrete parts of an aggregate network (e.g., two or more circuit boards coupled via one or more connectors). For instance, the application programs can include executable instructions that determine S-parameters for an embedded interconnecting structure (e.g., a connector) based on sets of S-parameters for each of the network(s) connected with the embedded and a set of S-parameters measured for the aggregate network. The instructions can access measurement data (e.g., stored in a drive or RAM 210 of the computer 200 or memory 254 of a remote computer), which data includes a first set of S-parameter data for a path associated with first and second ports of a first substrate, a second set of S-parameter data for a path associated with first and second ports of a second substrate, and a third set of S-parameter data for an aggregate path associated with the first port of the first substrate and the second port of the second substrate. The instructions can also calculate a fourth set of S-parameter data for a connector based on the first, second, and third sets of S-parameter data, such as described herein. Upon determining of the S-parameter data of the interconnecting structure, the application programs 232 can display them to the user via the output device 244, and/or employ the data in different application programs, which may be running on the computer system 200 or the remote computer 250.

Figure 5:
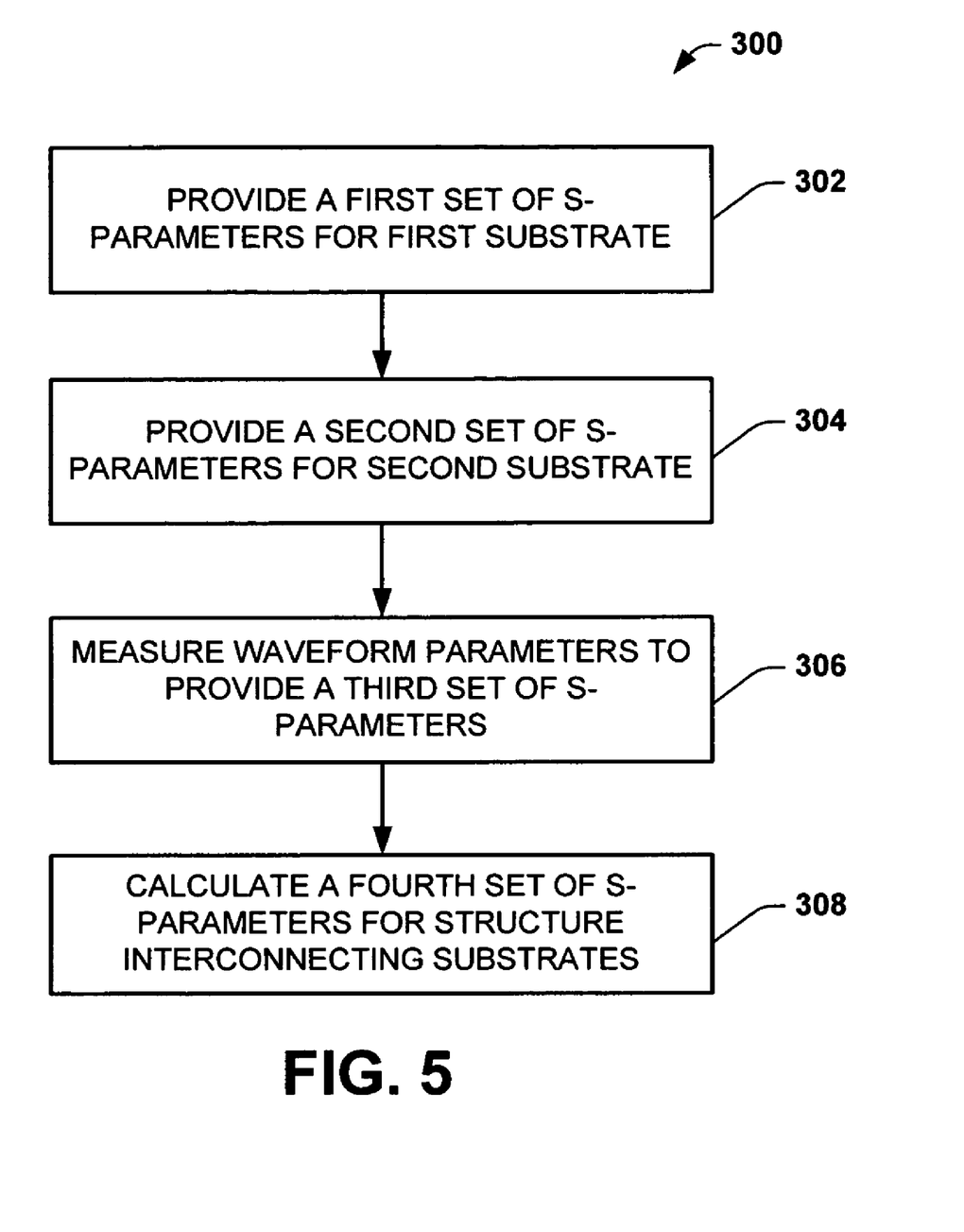
FIG. 5 is a flow diagram depicting an embodiment of a method for determining S-parameters.
Figure 6:
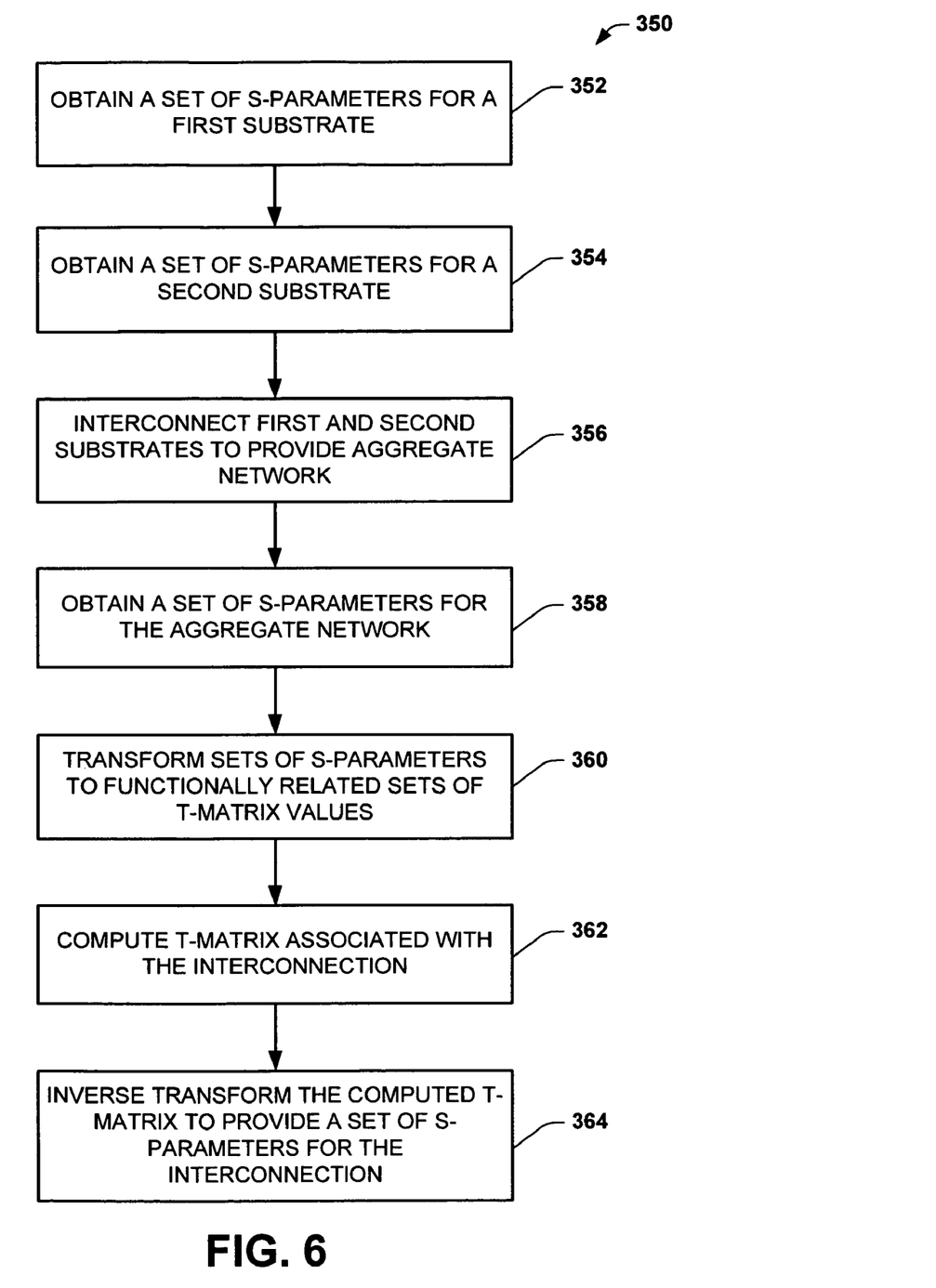
FIG. 6 is a flow diagram depicting another embodiment of a method for determining S-parameters.

In view of the foregoing structural and functional features described above, certain methods will be better appreciated with reference to FIGS. 5 and 6. It is to be understood and appreciated that the illustrated actions, in other embodiments, may occur in different orders and/or concurrently with other actions. Moreover, not all illustrated features may be required to implement a method. It is to be further understood that the following methodologies can be implemented in hardware (e.g., a computer or a computer network), software (e.g., as executable instructions stored on a computer readable media or running on one or more computer systems), or any combination of hardware and software.

FIG. 5 depicts a method 300 for determining the S-parameters of an embedded part of a network. The method may include providing a first set of S-parameters for a path between first and second ports associated with a first substrate, as shown at 310. At 320, a second set of S-parameters are provided for a path between first and second ports associated with a second substrate. At 330, the method includes measuring waveform parameters to determine a third set of S-parameters for a path between the first port of the first substrate and the second port of the second substrate. At 340, the method includes calculating a fourth set of S-parameters for a structure interconnecting the first and second substrates based on the first, second, and third sets of S-parameters.

FIG. 6 depicts another example of a method 350 for determining the S-parameters of an embedded part of a network. For example, as described herein, the method 350 can be employed to determine a set of S-parameters for an interconnection (e.g., a single port or multi-port connector) that connects a pair of substrates, such as printed circuit boards. The method 350 may begin at 352 with obtaining a set of S-parameters for a path between first and second ports associated with a first substrate. At 354, a second set of S-parameters is obtained for a path between first and second ports associated with a second substrate. The S-parameters can be obtained based on sets of waveform parameter measurements performed in the respective substrates or based on data provided by a manufacturer or previous testing for the respective substrates.

At 356, the first and second substrates are interconnected to provide an aggregate network. The substrates could be interconnected by an interconnection structure such as, for example, any embedded DUT for which S-parameters are to be determined (e.g., a connector). At 358, the method includes measuring waveform parameters for a path between the first port of the first substrate and the second port of the second substrate. The path being measured at 358 thus travels through an aggregate network that includes both substrates as well as the interconnection. A set of S-parameters for the aggregate network can be readily computed from the waveform parameters. At 360, each of the sets of S-parameters are transformed into respective functionally related sets of T-matrix values to allow matrix algebra to be performed on the measured values. At 362, a T-matrix associated with the interconnection is computed, such as by performing matrix multiplication to solve for the T-matrix associated with the interconnection.

At 364, an inverse transformation of the T-matrix, which is computed at 362, is performed to provide a set of corresponding S-parameters for the interconnection. The set of S-parameters thus includes the S-parameter values for the interconnection. Those skilled in the art will understand and appreciate that the set of S-parameters for the interconnection structure are independent of the adverse measurement effects of the first and second substrates. As described herein, adverse measurement effects (e.g., wave reflection) may arise from inherent structural characteristics of the parts (e.g., plated-through holes) of the substrates to which the interconnection structure is attached. The set of S-parameters provided at 364 thus represents S-parameter values that are independent of the adverse measurement effects caused by the first and second substrates.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications, and variations that fall within the spirit and scope of the appended claims.

What is claimed is:

1. A method comprising:
providing a first set S-parameters for a path of a first substrate having a first port and a second port;
providing a second set of S-parameters for a path of a second substrate having a first port and a second port;
measuring waveform parameters for an aggregate path that comprises the path of the first substrate, the path of the second substrate, and a structure interconnecting the first and second substrates to provide a third set of S-parameters for the aggregate path; and
calculating a fourth set of S-parameters for the structure interconnecting the first and second substrates based on the first, second, and third sets of S-parameters.

2. The method of claim 1, further comprising:
measuring waveform parameters associated with the first port and the second port of the first substrate to provide the first set of S-parameters; and
measuring waveform parameters associated with the first port and the second port of the second substrate to provide the second set of S-parameters.

3. The method of claim 1, wherein the structure interconnecting the first and second substrates comprises a connector.

4. The method of claim 3, wherein the connector comprises a sub-miniature connector.

5. The method of claim 1, wherein at least one of the first and second substrates comprises a printed circuit board.

6. The method of claim 5, wherein the printed circuit board further comprises an electrically conductive path between the first port and the second port of the at least one of the first and second substrates.

7. The method of claim 1, wherein at least one of the second port of the first substrate and the first port of the second substrate further comprises a plated through-hole to which the structure interconnecting the first and second substrates is attached to form the aggregate path.

8. The method of claim 1, wherein the calculating further comprises converting the first, second, and third sets of S-parameters into a matrix representation that functionally relates to the respective first, second and third sets of S-parameters.

9. The method of claim 8, wherein a T-matrix of values of the interconnecting structure is expressed as $[T_C]=[T_1]^{-1}[T_3][T_2]^{-1}$, where $[T_C]$ is the T-matrix of values of the interconnecting structure, $[T_1]$ is a T-matrix conversion of the first set of S-parameters, $[T_2]$ is a T-matrix conversion of the second set of S-parameters, and $[T_3]$ is a T-matrix conversion of the third set of S-parameters.

10. The method of claim 9, further comprising converting $[T_C]$ to the fourth set of S-parameters.

11. The method of claim 1, wherein the first substrate comprises a plurality of the second ports and the second substrate comprises a plurality of the first ports.

12. The method of claim 11, wherein the structure interconnecting the first and second substrates has a separate path for connecting each of the plurality of the second ports of the first substrate with respective ones of the plurality of the first ports of the second substrate.

13. The method of claim 12, wherein S-parameters associated with each separate path collectively provide the fourth set of S-parameters.

14. A system comprising:
a measurement system operative to access measurement data comprising a first set of S-parameter data for a path associated with a first port and a second port of a first substrate, a second set of S-parameter data for a path associated with a first port and a second port of a second substrate, and a third set of S-parameter data for a path associated with the first port of the first substrate and the second port of the second substrate; and
an S-parameter system operative to calculate a fourth set of S-parameter data for a structure interconnecting the second port of the first substrate and the first port of the second substrate based on the first, second, and third sets of S-parameter data.

15. The system of claim 14, wherein the structure interconnecting the first and second substrates comprises a connector.

16. The system of claim 15, wherein the connector comprises a sub-miniature connector.

17. The system of claim 14, wherein at least one of the first and second substrates comprises a printed circuit board.

18. The system of claim 14, wherein at least one of the second port of the first substrate and the first port of the second substrate further comprises a plated through-hole.

19. The system of claim 14, wherein at least one of the first and second substrate further comprises at least one electrically conductive path connecting the first port and the second port of the at least one of the first and second substrate.

20. The system of claim 14, wherein the S-parameter system comprises a matrix transform that converts the first, second, and third sets of S-parameters into a T-matrix transform to facilitate solving for the fourth set of S-parameters.

21. The system of claim 20, further comprising a calculator that performs matrix manipulation on the T-matrix to solve for a T-matrix of values associated with the interconnecting structure.

22. The system of claim 21, wherein the T-matrix of values of the interconnecting structure is expressed as $[T_C] = [T_1]^{-1}[T_3][T_2]^{-1}$, where $[T_C]$ is the T-matrix of values of the interconnecting structure, $[T_1]$ is a T-matrix conversion of the first set of S-parameters, $[T_2]$ is a T-matrix conversion of the second set of S-parameters, and $[T_3]$ is a T-matrix conversion of the third set of S-parameters.

23. The system of claim 21, further comprising a reverse transform that converts the T-matrix of values of the interconnecting structure to the fourth set of S-parameters.

24. The system of claim 14, wherein the first substrate comprises a plurality of the second ports and the second substrate comprises a plurality of the first ports, and the structure interconnecting the first and second substrates provides a separate path for connecting each of the plurality of the second ports of the first substrate with respective ones of the plurality of the first ports of the second substrate.

25. The system of claim 24, wherein S-parameters associated with each of the separate paths collectively provide the fourth set of S-parameters.

* * * * *